United States Patent [19]

Sumner

[11] 4,400,817
[45] Aug. 23, 1983

[54] METHOD AND MEANS OF CLOCK RECOVERY IN A RECEIVED STREAM OF DIGITAL DATA

[75] Inventor: Terence E. Sumner, Roselle, Ill.

[73] Assignee: Motorola, Inc., Schaumburg, Ill.

[21] Appl. No.: 221,190

[22] Filed: Dec. 30, 1980

[51] Int. Cl.³ .............................................. H03B 3/06
[52] U.S. Cl. .................................. 375/119; 331/1 A; 328/63
[58] Field of Search .................... 331/1 A, 76; 375/81, 375/82, 120, 119; 455/76, 182, 183; 328/134, 155, 63

[56] References Cited

U.S. PATENT DOCUMENTS

| | | | |
|---|---|---|---|
| 3,668,315 | 6/1972 | Heitzman | 375/119 |
| 3,946,323 | 3/1976 | Bjerede | 328/155 |
| 4,074,514 | 2/1978 | Vaucher | 331/177 |
| 4,105,979 | 8/1978 | Kage | 328/164 |
| 4,121,162 | 10/1978 | Alberkrack et al. | 455/183 |
| 4,151,485 | 4/1979 | La Fratta | 331/1 A |
| 4,216,544 | 8/1980 | Boleda et al. | 375/119 |
| 4,219,783 | 8/1980 | Carter et al. | 331/1 A |
| 4,280,099 | 7/1981 | Rattlingourd | 328/63 |
| 4,296,407 | 10/1981 | Minakuchi | 331/1 A |

*Primary Examiner*—Benedict V. Safourek
*Attorney, Agent, or Firm*—Charles L. Warren; Edward M. Roney; James W. Gillman

[57] ABSTRACT

Clock recovery in a received stream of digital data is effected by generating a high-speed clock pulse that is applied to a programmable divider to produce a recovered clock pulse. Comparison of the phase of the recovered clock pulse with that of a received signal causes accumulation of fast or slow counts that increase or decrease the division of the programmable divider to restore synchronism. The accumulated count is reduced for rapid recovery when the two signals are unsynchronized.

6 Claims, 6 Drawing Figures

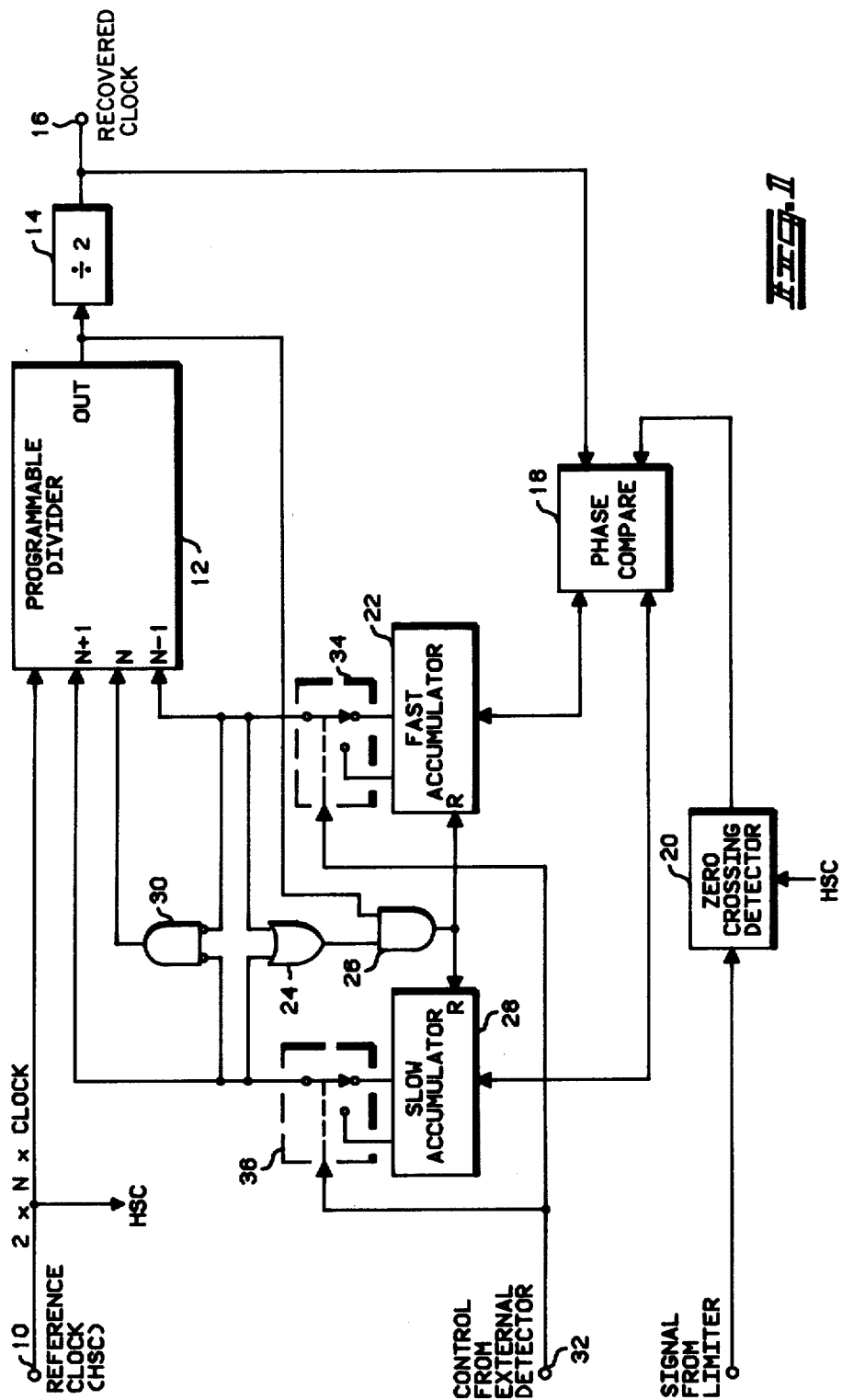

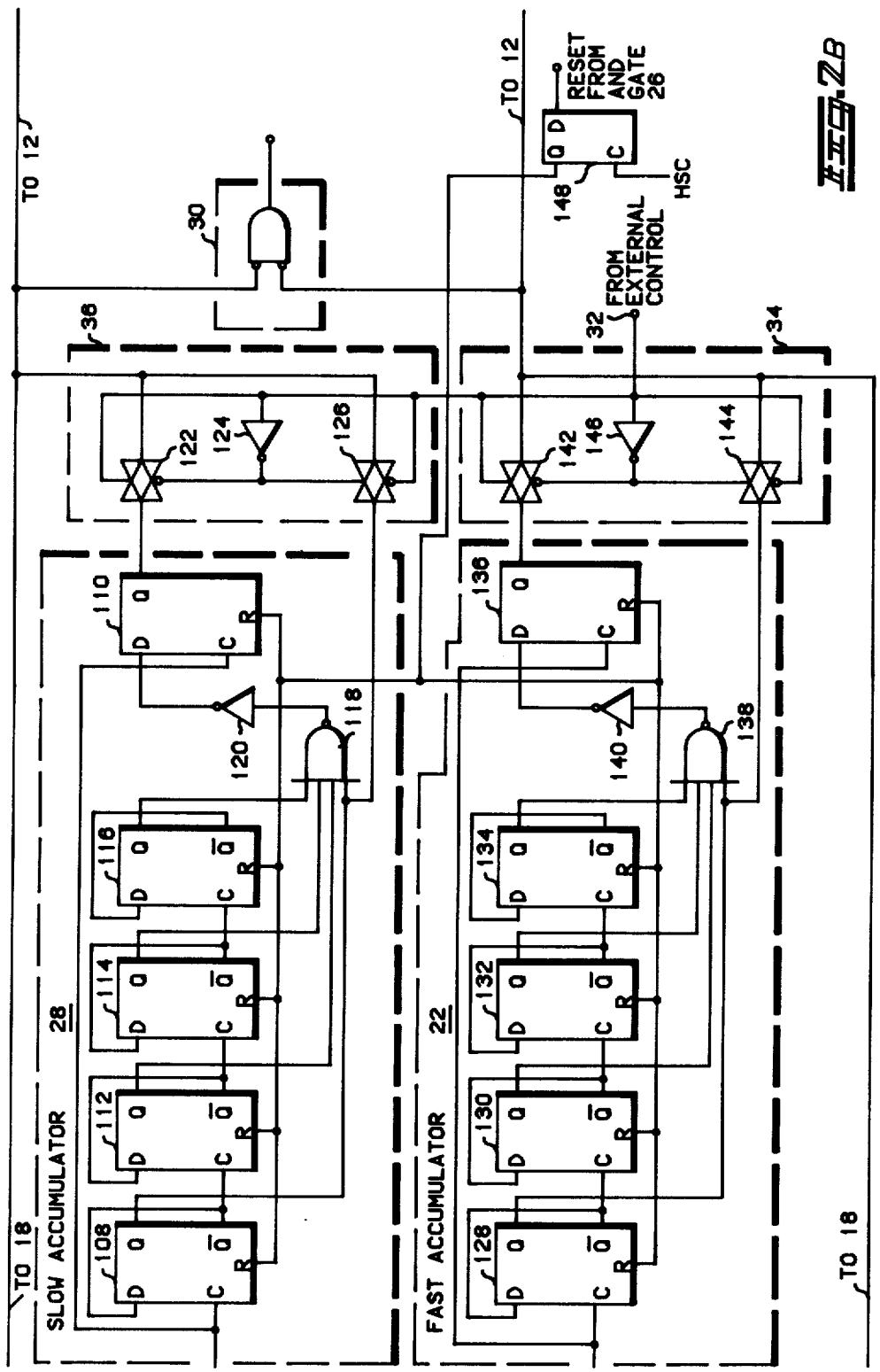

METHOD AND MEANS OF CLOCK RECOVERY IN A RECEIVED STREAM OF DIGITAL DATA

BACKGROUND OF THE INVENTION

This invention relates to the processing of digital signals. It is of particular utility in a system in which digital signals are broadcast or otherwise transmitted from one location to another.

When a stream of digital data is received for processing, it is necessary to establish a clock rate in the processor that is synchronized with the clock rate or received data. Some systems of digital encoding have one or more level transitions in each digit so that each digit carries its own synchronizing information. Such systems are seldom of use where digital signals are broadcast over radio channels since the price of carrying clock information in each bit is the requirement of additional bandwidth. For radio communication within channels of fixed bandwidth this would represent a required reduction in the data rate. A system for clock recovery from digital data that does not include a transition in each bit must provide a clock that is free-running when no synchronizing transitions occur. The clock must be able to maintain adequate synchronization with the received bit stream despite the presence of runs of time in which there may be no transitions of level to establish the edge of a digit. The system must be sufficiently tolerant of noise that it does not readily lose synchronism with the digital signal in the presence of random noise pulses. With the usable range of a radio communication system determined by the ability to distinguish signals from noise, it is important to minimize the loss of intelligibility stemming from poor synchronism, thus shifting the cause to the corruption of an individual digit by noise.

One final requirement for a clock recovery system is a compromise between two apparently inconsistent requirements. When one first attempts to establish communication with an incoming signal, it is desirable to establish synchronism as fast as possible. A clock recovery system that is initially out of synchronism should change rapidly to establish synchronism. However, if it changes fast to become synchronized, it may also change equally as fast to become unsynchronized in the presence of random noise pulses. This is undesirable.

Various methods have been used in the past to achieve synchronism or controlled timing in recovery circuits. Such systems normally involve phase-locked loops of one kind or another. One approach is to adjust the phase of recovered clock pulses by a variable amount. The variable amount is determined by taking the difference between the recovered clock pulses and the input signal and applying that phase difference to adjust the phase of the recovered clock pulse. Such a system is characterized, like most error-sensitive systems, by a phase adjustment that varies in size according to the amount of error. Such a system has poor tolerance to noise because it can easily become unsynchronized. Another approach that has been taken is to use an up-down counter to indicate whether the input data signal is synchronized with the recovered clock. If one is ahead of the other, that fact is indicated on the up-down counter which causes corrections that are proportional to the difference in phase. Common to each of the systems described is a sensitivity level that is fixed regardless of the difference between the clock rate of the input data and the recovered clock signal.

It is an object of the present invention to provide a better circuit for recovering clock signals in a digital data stream.

It is a further object of the present invention to provide a method of clock recovery that allows fast correction of large changes in phase between an input bit stream and recovered clock pulses.

It is a further object of the present invention to provide a circuit that is sensitive in responding to a need for small changes in clock phase to maintain synchronism.

Other objects will become apparent in the course of a detailed description of the invention.

SUMMARY OF THE INVENTION

Clock recovery in a received stream of digital data is effected by generating a high-speed clock pulse that is applied to a programmable divider to produce a recovered clock pulse. Comparison of the phase of the recovered clock pulse with that of a received signal causes accumulation of fast or slow counts that increase or decrease the division of the programmable divider to restore synchronism. The accumulated count is reduced for rapid recovery when the two signals are unsynchronized.

BRIEF DESCRIPTION OF THE DRAWINGS

FIG. 1 is a block diagram of a circuit for the practice of the present invention.

FIG. 2B is a portion of a circuit including accumulators and selector switches that form part of a circuit for the practice of the present invention.

DETAILED DESCRIPTION OF THE INVENTION

Figure 2A:
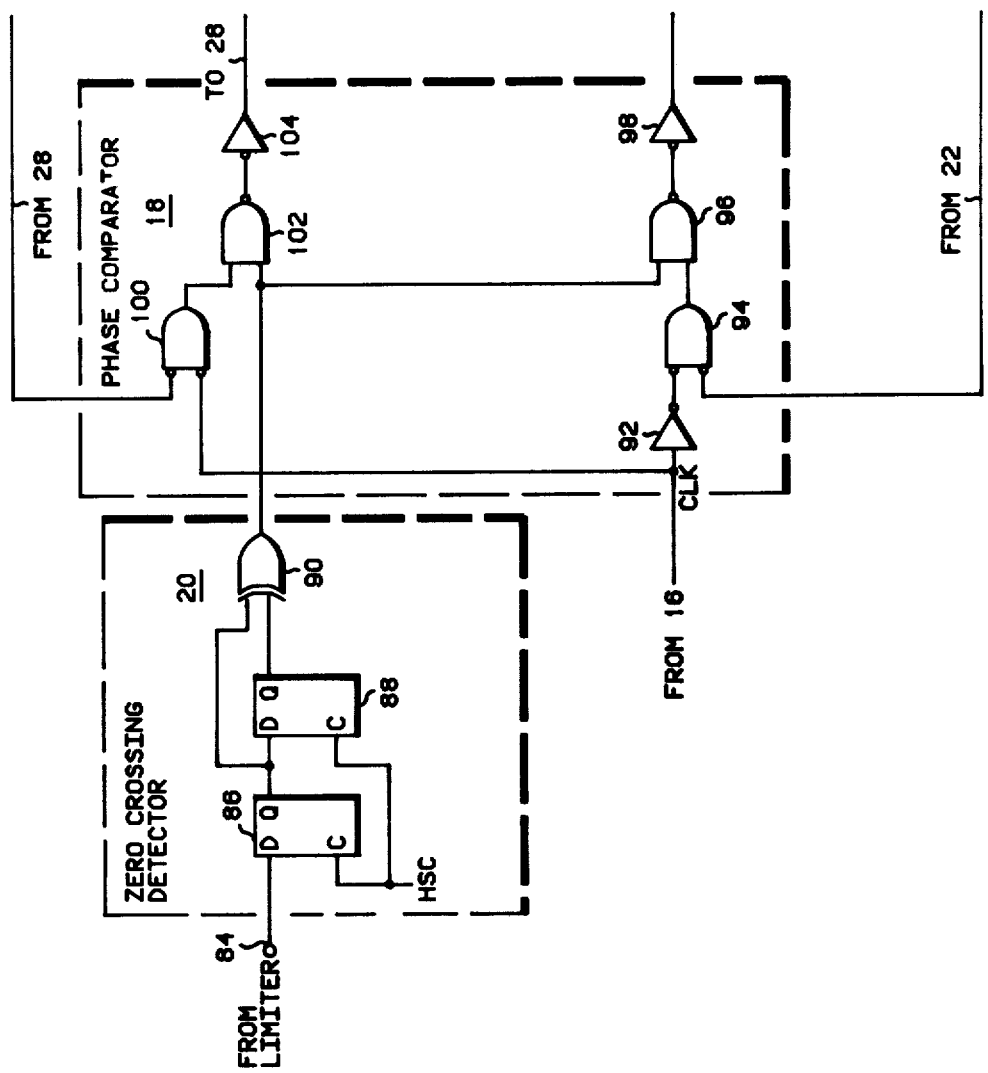
FIG. 2A is a portion of a circuit diagram including a zero-crossing detector and phase comparator that form part of a circuit for the practice of the present invention.

FIG. 1 is a block diagram of a circuit for the practice of the present invention. In FIG. 1 a terminal 10 receives a reference clock pulse that is generated elsewhere in the system by a crystal-controlled oscillator or the like. This pulse will be at a frequency that is a multiple of the clock frequency of the system. It will be referred to as the HSC (high-speed clock) pulse. For reasons that will be discussed later, the HSC pulse is at a frequency that is twice N times the desired clock frequency, where N is an integer that determines the precision of clock recovery. The HSC pulse is applied to programmable divider 12 which usually divides the HSC pulse by N to produce an output pulse that is twice the clock frequency. The output of programmable divider 12 is applied to a divide-by-2 counter 14 which produces pulses at the desired clock frequency on terminal 16. The output of divide-by-2 counter 14 is also applied as one input to a phase comparator 18. At the same time, a received stream of binary digits or bits from a limiter or other source of digital data is applied to zero-crossing detector 20 which is clocked by an HSC pulse. A zero crossing is detected whenever there is a change in levels to another level the signal crosses the decision point, or zero, between the levels, zero-crossing detector 20 generates a pulse which is also applied to phase comparator 18 for comparison with the recovered clock pulses at terminal 16. There are several possible conditions at the inputs to phase comparator 18. The first is that the signal from the limiter is produced by a bit stream that does not have a level change between adjacent bits. If this in the case and if two adjacent bits have the same logical sense, then zero-crossing detector 20 will not detect a zero-crossing and phase comparator 18 will generate no output. In this situation there is no information that would direct a change in the phase of the recovered clock pulse at terminal 16. Thus, the programmable divider 12 divides the HSC pulse by N.

Another possibility is that the pulse from the zero-crossing detector 20 leads the recovered clock pulse. Phase comparator 18 will then generate an output that is coupled to fast accumulator 22. When a predetermined number of such pulses fills fast accumulator 22, an output level is generated that is applied at the (N−1) terminal of programmable divider 12. This causes programmable divider 12 to divide once by the quantity (N−1). The division occurs just once for each filling of fast accumulator 22 because the output level is applied to OR gate 24, thence to AND gate 26 to reset fast accumulator 22. As a result, fast accumulator 22 fills to generate one pulse and is then reset to fill again.

If the recovered clock pulse at terminal 16 is fast in comparison with the output signal from zero-crossing detector 20, a pulse is generated that is coupled to slow accumulator 28. This, in turn, accumulates pulses until it fills, in which case slow accumulator 28 generates an output level that is coupled to programmable divider 12 to cause it to divide once by (N+1). The output level from slow accumulator 28 is also coupled through OR gate 24, thence to AND gate 26 to reset slow accumulator 28. The second input to AND gate 26 is a pulse from the output of programmable divider 12, so that both accumulators 22 and 28 reset only on the combination of an output from either accumulator 22 or 28 and the completion of the current divide cycle. Another possibility is that the zero-crossing pulse occurs simultaneously with the accumulator reset. In this case the zero-crossing pulse is in the phase or in quadrature with the recovered clock and no correction is necessary. If simultaneous increment and reset signals are applied to either accumulator the reset signal overrides inhibiting an accumulation. However, if the accumulator does not fill with the zero-crossing pulse and so no reset occurs, then the pulse will be accumulated in the appropriate accumulator. It should also be noted that when one accumulator 22 or 28 is reset, so is the other. This reduces the jitter in programmable divider 12 that would result if both accumulators were nearly full and filled within a few pulses of each other.

Two other features appear from FIG. 1. First, if there is no output either from fast accumulator 22 or slow accumulator 28, then invert-AND gate 30 provides a signal if necessary to programmable divider 12 to cause it to divide by N. The result is that when clock has been recovered, programmable divider 12 divides by N most of the time, except when an occasional filling of an accumulator 22 or 28 causes a correction to adjust synchronism. The other feature of FIG. 1 that appears is the presence of a signal at terminal 32 from an external detector that indicates whether or not phase lock is achieved. This control is taken to switches 34 and 36 which select different outputs from fast accumulator 22 and slow accumulator 28 respectively. If the signal at terminal 32 indicates that the recovered clock is not phase-locked with the signal that enters zero-crossing detector 20, then it is not desirable to take the time necessary to fill either fast accumulator 22 or slow accumulator 28 to achieve synchronism. Accordingly, switches 34 and 36 are operated to select signals at lower accumulation levels of accumulators 22 and 28. When this happens, programmable divider 12 may divide by either (N+1) or N on one half cycle of clock and either N or (N−1) on the other half cycle of the clock from divide-by-2 counter 14. The alternation results from the fact that phase comparator 18 receives signals that represent outputs from programmable divider 12 divided by 2 in divide-by-2 counter 14. Thus, the outputs of phase comparator 18 are limited as follows: either to no pulses or to pulses to fast accumulator 22 on one half cycle of the recovered clock; either to no pulses or to pulses to slow accumulator 28 on the other half cycle of the clock. Thus, the fastest change in phase that can be made in the recovered clock pulse at terminal 16 is achieved by causing programmable divider 12 to follow either a dividing sequence N, N+1, N, N+1 . . . or the reverse, N, N−1, N, N−1 . . . . One or the other of these sequences will be followed until phase lock is achieved. This will cause a signal at terminal 32 to operate switches 34 and 36. When switches 34 and 36 are in the positions associated with phase lock, the programmable divider 12 will never have fewer consecutive divisions by N than the number of counts that is needed to fill the accumulator 22 and 28. this is true for ideal signals uncorrupted by noise pulses. Noise may add counts to fill an accumulator faster.

Figure 2C:
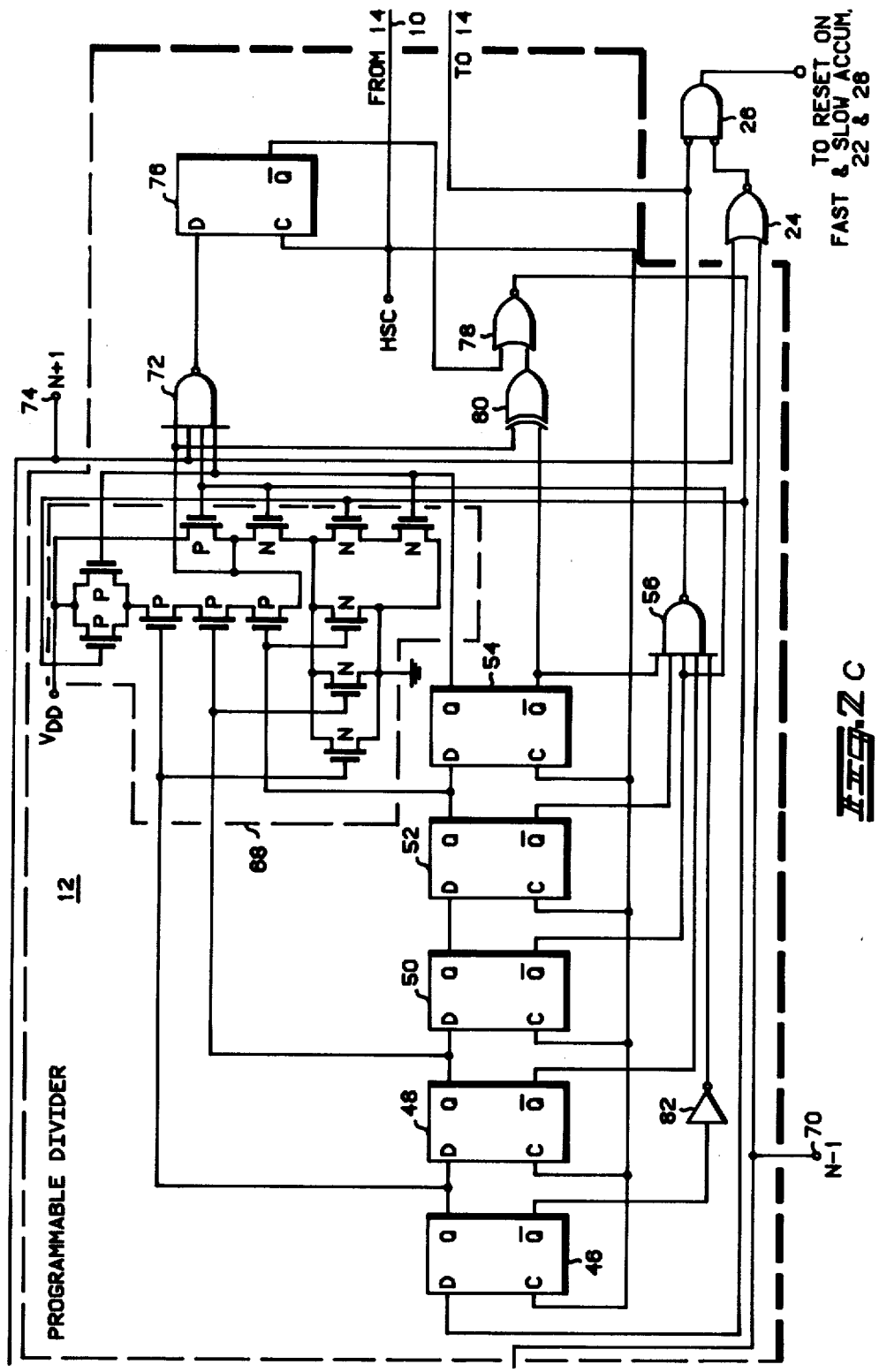
FIG. 2C is a programmable divider that forms part of a circuit for the practice of the present invention.
Figure 2D:
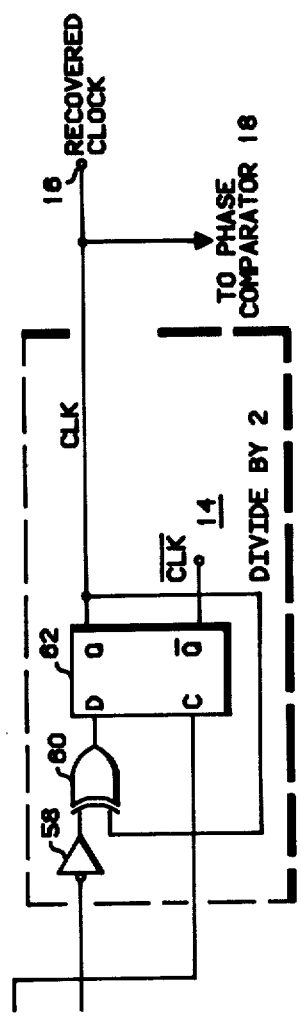
FIG. 2D is a divide-by-two circuit that forms part of a circuit for the practice of the present invention.

FIG. 2, labelled 2A, 2B, 2C and 2D, is a circuit diagram that embodies the block diagram of FIG. 1. FIG. 2 is a realization that has been achieved as an integrated circuit. It receives an input at terminal 10 which is the high-speed clock (HSC) pulse. The purpose of the circuit is to generate a train of rectangular pulses at a frequency that is nominally one-half of one-Nth of the frequency of the high-speed clock and that is synchronized in phase with a received signal to a precision of one HSC pulse. The high-speed clock signal entering at terminal 10 is taken as a clocking input to a plurality of flip-flops in programmable divider 12 and divide-by-2 counter 14. Flip-flops 46, 48, 50, 52 and 54 are cascaded to form a shift register. In the absence of any other controlling input to the circuit, a single pulse will be produced as an output from NAND gate 56 for each 32 cycles of the high-speed clock. This represents division by 32 which is th value of N for the circuit of FIG. 2, as evidenced by the cascading of s five flip-flops. The output pulse from NAND gate 56 is taken as one input to AND gate 26 which controls the reset of fast and slow accumulators 22 and 28. The output of NAND gate 56 is also the input to divide-by-2 counter 14, where it is inverted by inverter 58 and applied to exclusive-OR gate 60. The output of exclusive-OR gate 60 is taken as an input to flip-flop 62. The second input to exclusive OR gate 60 is the output of flip-flop 62, so that flip-flop 62 generates 62 generates an output pulse for every other input pulse to inverter 58 representing division by 2.

Referring again to FIG. 1, invert-AND gate 30 was there described as providing an output which would set programmable divider 12 to divide by N. The divider 12 of FIG. 2C divides by N (here 32) in the absence of modification. For this reason, the output of gate 30 in FIG. 1 is not shown as having any input to programmable divider 12 in FIG. 2C because its function is not needed. In addition, other modifications that will be described change the operation of programmable divider 12. A complex gate 68 is shown here as an array of complementary field-effect transistors. In conjunction with exclusive-OR gate 80 complex gate 68 operates to make the shift register of which flip-flops 46 through 54 form the basis into a linear-feedback shift register that generates an output pulse each time it counts to 32 and that deletes a count each time it receives an input on terminal 70 to cause the counter to count only to 31. This operation will be made clearer with later reference to FIG. 3, which is a functional description of complex gate 68 which shows the logic that complex gate 68 performs.

The output of complex gate 68 is one of four inputs to NAND gate 72. The other three inputs to NAND gate 72 are the N+1 control Q signal at terminal 74, the Q signal from flip-flop 50 and the Q signal from flip-flop 54. The output from NAND gate 72 is taken as an input to flip-flop 76, and the Q output from flip-flop 76 is take as one input to a NOR gate 78. The other input to NOR gate 78 is the output of exclusive-OR gate 80 which has as inputs the output of complex gate 68 and the Q output of flip-flop 54. The output of NOR gate 78 is connected in turn to the input of flip-flop 46 to supply the input pulses that are moved through flip flops 46 through 54.

The output of programmable divider 12 is taken from the output of NAND gate 56 which has as inputs the Q outputs of flip-flops 48, 50, 52 and 54 and the Q output of flip-flop 46 inverted by inverter 82. Simultaneous zeroes at these inputs produce a pulse at the output of NAND gate 56 every 31, 32 or 33 pulses of the high-speed clock depending on whether or not there is a signal at terminal 70 or terminal 74, or neither. The divided pulse is taken to divide-by-2 counter 14 in which it is divided by 2, as described earlier, to produce a train of recovered clock pulses at terminal 16. The recovered clock pulse is taken as one input to phase comparator 18 which is shown in detail in FIG. 2A. A bit stream for comparison is applied at terminal 84. This bit stream will typically be taken from a source such as a radio receiver. If the receiver does not include a limiter, the bit stream may be applied to one. The bit stream at terminal 84 is applied to zero-crossing detector 20 first as the input to a flip-flop 86 which is cascaded with a flip-flop 88. Flip-flops 86 and 88 are both clocked by the high-speed clock pulse and their Q outputs are taken as inputs to exclusive-OR gate 90. Exclusive-OR gate 90 generates an output only when the outputs of flip-flops 86 and 88 are different. The output of exclusive-OR gate 90 is the output of zero-crossing detector 20. It is a pulse of the width of one high-speed clock pulse that marks a level change on the signal at terminal 84. The output of zero-crossing detector 20 is taken as an input to phase comparator 18 to be compared with the recovered clock pulse from terminal 16. The recovered clock pulse from terminal 16 is applied to an inverter 92, thence to an invert-AND gate 94 which is disabled on an input from fast-accumulator 22. The output of invert-AND gate 94 is taken as one input to a NAND gate 96 for which the other input is the output of zero-crossing detector 20. The output of NAND gate 96 is inverted by inverter 98 to produce a pulse that is applied to fast accumulator 22 to indicate that the recovered clock is behind the bit stream from the limiter.

The recovered clock signal from terminal 16 is also applied to an invert-AND gate 100 which has as a second input an enabling signal from slow accumulator 28. The output of invert-AND gate 100 is combined with the output of zero-crossing detector 20 in NAND gate 102. The output of NAND gate 102 is inverted by inverter 104 to produce a pulse that is taken to slow accumulator 28 to increment one cycle in which it is observed that the phase of the recovered clock is fast in comparison with the bit stream from the limiter.

Three things appear from inspection of phase comparator 18 in FIG. 2A. The first is that a signal from slow accumulator 28 blocks invert AND gate 100 to prevent the passage of slow pulses to slow accumulator 28. Similarly, a signal from fast accumulator 22 in invert-AND gate 94 blocks the accumulation of fast pulse in fast accumulator 22. The function of each of these signals is to assure that each accumulator 22 and 28 is reset only by a reset signal, rather than by counting to overflow. A second thing that occurs from examination or the phase comparator 18 is that the presence of inverter 92 assures that if there is an output pulse from inverte 104, then there will not be one from inverter 98, and vice versa. A third result to be noted is that if the signal from the limiter on terminal 84 stays high or stays low so that there is no zero crossing to be detected, NAND gates 96 and 102 will prevent the occurrence of either a fast pulse or a slow pulse from phase comparator 18.

The output of inverter 104 in phase comparator 18 taken to slow accumulator 28, and the output of inverter 98 in phase comparator 18 is taken to fast accumulator 22. Both accumulators are shown in detail in FIG. 2B. Since they are identical in structure and function, only slow accumulator 28 will be described in detail. When a pulse from inverter 104 of phase comparator 18 indicates that the recovered clock signal is fast in comparison with the limiter signal at terminal 84, that pulse is coupled as a clock input to flip-flops 108 and 110. Flip-flops 108, 112, 114 and 116 are connected as a binary counter. Their Q outputs are connected to NAND gate 118 which generates a low output when they are all high. That output is inverted by inverter 120 which produces a input pulse at flip-flop 110. The combination of these elements in slow accumulator 28 provides a resettable synchronous binary counter that counts to 16. The Q output of flip-flop 110 is taken to switch 36 where it is applied to transmission gate 122. Transmission gate 122 is operated by a signal at terminal 32 from an external control device that is responsive to detected synchronism. The same signal is inverted by inverter 124 and applied to operate transmission gate 122. When the signal at terminal 32 indicates that the limiter signal and the recovered clock are synchronized, transmission gate 122 passes the output of slow accumulator 28 when it fills. If the signal at terminal 32 indicates a lack of synchronism, that signal and inverter 124 turn off transmission gate 122 and turn on transmission gate 126 which applies the output of flip-flop 108 through transmission gate 126 to programmable divider 12. As a result, when synchronism is detected slow accumulator 28 counts to 16 before calling for a correction. When signals are not synchronized, slow accumulator 28 counts only to 1 before calling for a correction. Fast accumulator 22 operates identically with flip-flops 128, 130, 132, 134 and 136 connected to form a synchronous binary counter along with NAND gate 138 and inverter 140. Transmission gates 142 and 144 are operated by inverter 146 and the signal from external control at terminal 32 to pass a signal to programmable divider 12 whenever fast accumulator 22 fills. A reset signal from gate 26 of FIG. 2C is applied through flip-flop 148 which eliminates a possible race condition in resetting slow accumulator 28 and fast accumulator 22.

Figure 3:
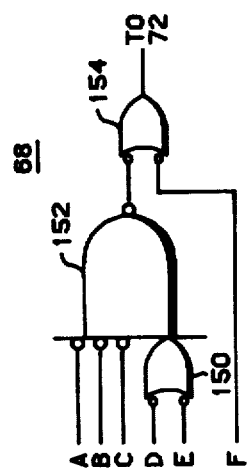
FIG. 3 is, consisting of A–F, a functional description of the complex gate of FIGS. 2A, 2B, 2C, and 2D.

FIG. 3 is a gate realization that is added to illustrates the functions performed by complex gate 68. In FIG. 3 a two-input invert-OR gate 150 receives as inputs two lines labeled D and E. The output of invert-OR gate 150 is taken as an input to AND gate 152 which also has as inputs the inversions of inputs labeled A, B and C. The inverted output of AND gate 152 is applied to invert-OR gate 154 along with an input labeled F. The output of invert-OR gate 154 is taken as one input to NAND gate 72 in FIG. 2C. Inputs to complex gate 68 and the conditions that produce a desired output are summarized in the Table in which each input to complex gate 68 is identified by its letter in FIG. 3 and its source in FIG. 2C.

TABLE

INPUTS TO COMPLEX GATE 68 TO PROVIDE A ZERO AT AND-GATE 72

| A Q1 | B Q2 | C Q4 | D Q5 | E K | F Q3 | 68 Output |
|---|---|---|---|---|---|---|
| X | X | X | X | X | 0 | 1 |
| X | X | X | 1 | 1 | 1 | 0 |
| 0 | 0 | 0 | 1 | 0 | X | 1 |
| 0 | 0 | 0 | 0 | 1 | X | 1 |
| 0 | 0 | 0 | 0 | 0 | X | 1 |
| 1 | X | X | X | X | 1 | 0 |
| X | 1 | X | X | X | 1 | 0 |
| X | X | 1 | X | X | 1 | 0 |

Q1 = Q of flip-flop 46
Q2 = Q of flip-flop 48
Q3 = Q of flip-flop 50
Q4 = Q of flip-flop 52
Q5 = Q of flip-flop 54
K = (N-1)

Thus, the A input is the Q output of flip-flop 46 in FIG. 2C, and the E input is the N−1 terminal of FIG. 2C. The Table also lists the states of the inputs that will produce a zero output to AND gate 72. The output of complex gate 68 will be zero, except for three conditions: A, B, C and D all equal 0; A, B, C and E al equal 0; or F equals 0. The first of these conditions produces a divide by 31. The second occurs when the divider is dividing by 32 and 33. The third occurs normally during all three divisions. AND gate 72 will produce a zero once during a divide-by-33 cycle, when the output of complex gate 68 is 1, the signal from N+1 control 74 is 1, Q of flip-flop 54 is 1, and Q of flip-flop 50 is 1.

I claim:

1. A method of obtaining a recovered clock signal that is synchronized and in phase with a received digital signal at a known frequency, the method comprising the steps of:
  a. applying to a programmable divider a highspeed clock signal that is a known multiple of the known frequency and dividing said clock signal by a certain predetermined number to produce the recovered clock signal;
  b. comparing phase of the recovered clock signal with phase of the received digital signal to obtain a measure of whether the recovered clock signal is fast or slow with respect to the received digital signal;
  c. accumulating in a first accumulator to a first predetermined number a first count of measures if the recovered clock signal is fast with respect to the received digital signal;
  d. accumulating in a second accumulator to a second predetermined number a second count of measures if the recovered clock signal is slow with respect to the received digital signal;
  e. changing said certain predetermined number to a smaller number if said second count of measures reaches said second predetermined number and changing said certain predetermined number to a larger number if said first count of measures reaches said first predetermined number;
  f. reducing the accumulated first and second counts of measure to zero; and
  g. repeating the preceding steps until the recovered clock signal is synchronized and in phase with the received digital signal.

2. The method of claim 1 comprising in addition the steps of:
  a. detecting a lack of synchronism between the recovered clock signal and the received digital signal;
  b. reducing the first and second predetermined numbers to lower values until synchronism is detected; and
  c. restoring the first and second predetermined numbers to their original values.

3. A circuit for obtaining from a high-speed clock input a recovered clock signal at a frequency lower than the high-speed clock frequency, the recovered clock signal synchronized in frequency and locked in phase with a received digital signal, the circuit comprising:
  a. a programmable divider receiving the high-speed clock input and having a certain predetermined number by which said divider divides said high-speed clock input to produce the recovered clock signal;
  b. means for comparing phase of the recovered clock signal with phase of the received digital signal and for generating fast signals if the recovered clock signal is slow with respect to the received digital signal and slow signals if the recovered clock signal is leading with respect to the received digital signal;
  c. first counting means for accumulating a slow count consisting of said slow signals and a second counting means for accumulating a fast count consisting of said fast signals; and
  d. means for changing said certain predetermined number to a smaller number when said slow count reaches a first predetermined number and to a larger number when said fast count reaches a second predetermined number.

4. The circuit of claim 3 further comprising resetting means for resetting said first counting means upon the latter reaching said first predetermined number and for resetting said second counting means upon the latter reaching said second predetermined number.

5. The circuit of claim 4 comprising in addition means for reducing each of said first and second predetermined numbers to smaller numbers in response to an indication that the recovered clock signal and the received digital signal are out of synchronism.

6. The circuit of claim 4 wherein said resetting means resets both said first and second counting means upon said first counting means reaching said first predetermined number and upon said second counting means reaching said second predetermined number.

* * * * *